US012803509B2

(12) United States Patent
Han et al.

(10) Patent No.: US 12,803,509 B2
(45) Date of Patent: Nov. 17, 2026

(54) POWER AMPLIFICATION CIRCUIT AND POWER AMPLIFIER

(71) Applicant: ZTE CORPORATION, Shenzhen (CN)

(72) Inventors: Hui Han, Shenzhen (CN); Yaobin Guo, Shenzhen (CN); Xiaoping Wang, Shenzhen (CN); Huanqing Xiao, Shenzhen (CN)

(73) Assignee: ZTE Corporation, Shenzhen (CN)

(*) Notice: Subject to any disclaimer, the term of this patent is extended or adjusted under 35 U.S.C. 154(b) by 395 days.

(21) Appl. No.: 18/683,551

(22) PCT Filed: Jul. 22, 2022

(86) PCT No.: PCT/CN2022/107473
§ 371 (c)(1),
(2) Date: Feb. 14, 2024

(87) PCT Pub. No.: WO2023/024785
PCT Pub. Date: Mar. 2, 2023

(65) Prior Publication Data

US 2024/0356502 A1 Oct. 24, 2024

(30) Foreign Application Priority Data

Aug. 25, 2021 (CN) ........................ 202110978778.X

(51) Int. Cl.
*H03F 3/213* (2006.01)
*H03F 1/56* (2006.01)
*H03F 3/21* (2006.01)

(52) U.S. Cl.
CPC ............... *H03F 3/213* (2013.01); *H03F 1/56* (2013.01); *H03F 3/211* (2013.01);
(Continued)

(58) Field of Classification Search
CPC ............ H03F 3/213; H03F 1/56; H03F 3/211; H03F 2200/387; H03F 2200/451; H03F 2203/21106
(Continued)

(56) References Cited

U.S. PATENT DOCUMENTS 4,263,559 A 4/1981 Ho
6,374,092 B1 4/2002 Leizerovich et al.
(Continued)

FOREIGN PATENT DOCUMENTS

CN 1300132 A 6/2001
CN 102355198 A * 2/2012 ........... H03F 1/0288
CN 111384901 A * 7/2020 ............... H03F 1/07

OTHER PUBLICATIONS

Kim et al., "Compact Three-Way LMBA With Arbitrary Power Back-Off Level in 28 nm CMOS", IEEE Journal of Microwaves, Jul. 2026 (Year: 2026).*

(Continued)

*Primary Examiner* — Hafizur Rahman
(74) *Attorney, Agent, or Firm* — Vivacqua Crane, PLLC

(57) ABSTRACT

Disclosed are a power amplification circuit and a power amplifier. The power amplification circuit may include: a power distribution device, a carrier amplification device, and a plurality of peak amplification devices; the power distribution device is configured for dividing an input power to obtain a plurality of divided powers, and the plurality of divided powers are respectively output to input ends of the carrier amplification device and the peak amplification devices; a first combining point is arranged at an output end of a first peak amplification device, and an output end of a second peak amplification device is connected to the first combining point by a first impedance compensation device; and a second combining point is arranged at an output end of the carrier amplification device, and the first combining point is connected to the second combining point by a second impedance compensation device.

14 Claims, 3 Drawing Sheets

(52) U.S. Cl.
CPC .................. *H03F 2200/387* (2013.01); *H03F 2200/451* (2013.01); *H03F 2203/21106* (2013.01)

(58) Field of Classification Search
USPC .......................................................... 330/297
See application file for complete search history.

(56) References Cited

U.S. PATENT DOCUMENTS

| | | | | |
|---|---|---|---|---|
| 9,667,199 | B1 * | 5/2017 | McLaren | H03F 3/195 |
| 9,917,551 | B2 * | 3/2018 | McLaren | H03F 3/195 |
| 10,418,947 | B2 * | 9/2019 | Grebennikov | H03F 1/56 |
| 2018/0254749 | A1 | 9/2018 | Grebennikov et al. | |
| 2021/0167735 | A1 * | 6/2021 | Baroudi | H03F 3/19 |

OTHER PUBLICATIONS

Dietrich et al., "Load and Frequency Independent Doherty Power Amplifier Back-Off Extension", IEEE Transactions on Microwave Theory and Techniques, vol. 72, No. 6, Jun. 2024 (Year: 2024).*

Lyu et al., "Hybrid Load-Modulated Balanced Amplifier With High Linearity and Extended Dynamic Range", IEEE Microwave and Wireless Components Letters, vol. 31, No. 9, Sep. 2021 (Year: 2021).*

Cao et al.,"Hybrid Asymmetrical Load Modulated Balanced Amplifier With Wide Bandwidth and Three-Way-Doherty Efficiency Enhancement", IEEE Microwave and Wireless Components Letters, vol. 31, No. 6, Jun. 2021 (Year: 2021).*

Omi et al., "Miniaturized Wideband Three-Way Power Dividers With Arbitrary Band Ratio Using a New Analytical Design Technique", Jul. 13, 2023 (Year: 2023).*

While Kim et al., (Highly Linear Three-Way Doherty Amplifier With Uneven Power Drive for Repeater System, IEEE Microwave and Wireless Components Letters, vol. 16, No. 4, Apr. 2006. (Year: 2006).*

International Searching Authority. International Search Report and Written Opinion for PCT Application No. PCT/CN2022/107473 and English translation, mailed Oct. 10, 2022, pp. 1-10.

European Patent Office. Extended European Search Report for EP Application No. 22860131.6, mailed Nov. 26, 2024, pp. 1-16.

Xia, J., et al. "Improved Three-Stage Doherty Amplifier Design With Impedance Compensation in Load Combiner for Broadband Applications," IEEE Transactions on Microwave Theory and Techniques, vol. 67, No. 2, Feb. 2019, pp. 778-786.

* cited by examiner

POWER AMPLIFICATION CIRCUIT AND POWER AMPLIFIER

CROSS-REFERENCE TO RELATED APPLICATION

This application is a national stage filing under 35 U.S.C. § 371 of international application number PCT/CN2022/107473, filed Jul. 22, 2022, which claims priority to Chinese patent application No. 202110978778.X, filed Aug. 25, 2021. The contents of these applications are incorporated herein by reference in their entirety.

TECHNICAL FIELD

The present disclosure relates to the field of communication technologies, and more particularly, to a power amplification circuit and a power amplifier.

BACKGROUND

With the advancement of communication technologies and the introduction of 5th Generation (5G) mobile technologies, the modulation of communication signals becomes more and more complex, which is reflected in the hardware requirements for the increasing peak-to-average ratio of signals, and the difference between the total power of the power amplifier and the actual power transmitted to the antenna load is becoming larger. To ensure the energy-saving and environmental protection requirements of the base station system, the power amplifier is required to maintain high efficiency in a large dynamic range. Doherty technology is an efficient technology for increasing power amplifier efficiency and has been widely used in the actual network environments of various communication operators. However, the existing Doherty technology has various problems in the back-off efficiency, linearity, and layout area of the power amplifier, greatly limiting the application range of the power amplifier and increasing the design difficulty of the power amplifier. Consequently, developing a radio frequency power amplification circuit that is both highly efficient and highly linear has become a major research focus in academia and the communication industry.

SUMMARY

The following is a summary of the subject matter set forth in this description. This summary is not intended to limit the scope of protection of the claims.

Embodiments of the present disclosure provide a power amplification circuit and a power amplifier, to effectively improve the efficiency of power amplification, simplify the structure of the power amplification circuit, achieve a flexible impedance design for load testing, and reduce the design difficulty of the power amplifier.

In accordance with a first aspect of the present disclosure, an embodiment provides a power amplification circuit, including: a power distribution device, a carrier amplification device, and a plurality of peak amplification devices, where the plurality of peak amplification devices include at least a first peak amplification device and a second peak amplification device; the power distribution device is configured for dividing an input power to obtain a plurality of divided powers, and the plurality of divided powers are respectively output to input ends of the carrier amplification device and the peak amplification devices;

a first combining point is arranged at an output end of the first peak amplification device, and an output end of the second peak amplification device is connected to the first combining point by a first impedance compensation device; and a second combining point is arranged at an output end of the carrier amplification device, and the first combining point is connected to the second combining point by a second impedance compensation device.

In accordance with a second aspect of the present disclosure, an embodiment provides a power amplifier, including the power amplification circuit described above.

Additional features and advantages of the present disclosure will be set forth in the description which follows, and in part will be obvious from the description, or may be learned by the practice of the present disclosure. The objects and other advantages of the present disclosure can be realized and obtained by the structures particularly pointed out in the description, claims and drawings.

BRIEF DESCRIPTION OF DRAWINGS

The drawings are provided for a further understanding of the technical schemes of the present disclosure, and constitute a part of the description. The drawings and the embodiments of the present disclosure are used to illustrate the technical schemes of the present disclosure, and are not intended to limit the technical schemes of the present disclosure.

DETAILED DESCRIPTION

Figure 1:
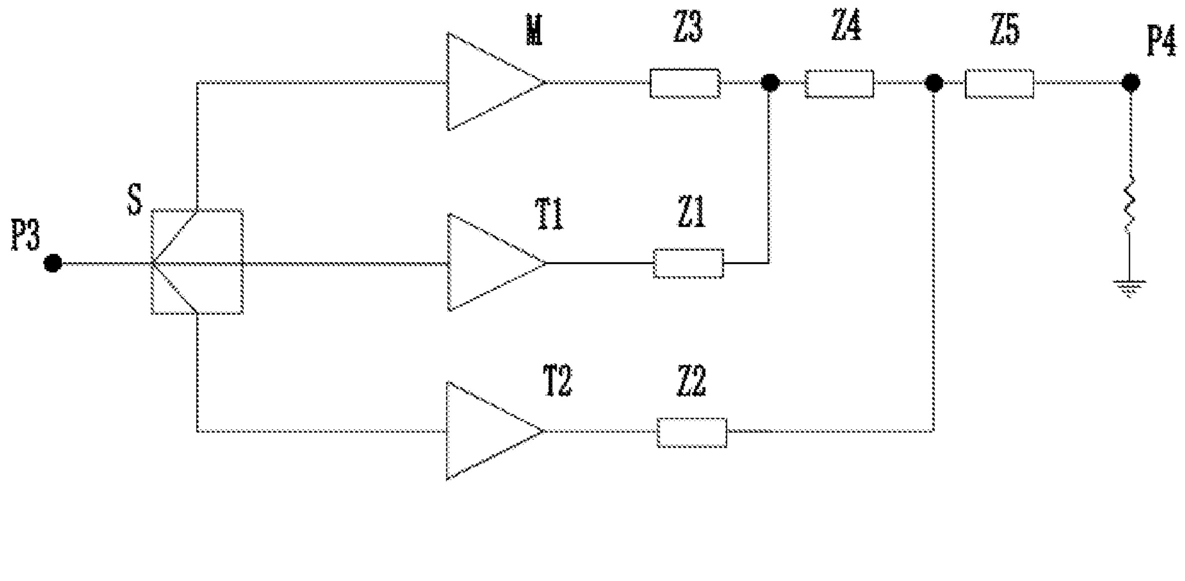
FIG. 1 is a block diagram of a conventional power amplification circuit.

To make the objects, technical schemes, and advantages of the present disclosure clear, the present disclosure is described in further detail in conjunction with accompanying drawings and examples. It should be understood that the specific embodiments described herein are merely used for illustrating the present disclosure, and are not intended to limit the present disclosure.

It should be understood that in the description of the embodiments of the present disclosure, the terms such as “first”, “second” and the like used herein are merely used for distinguishing technical features, and are not intended to indicate or imply relative importance, or implicitly point out the number of the indicated technical features, or implicitly point out a precedence order of the indicated technical features. The term “at least one” means one or more, and the term “a plurality of” means two or more. The term “and/or” is used for describing an association between associated objects and representing that three associations may exist. For example, “A and/or B” may indicate that only A exists, only B exists, and both A and B exist, where A and B may be singular or plural. The character “/” generally indicates an “or” relation between the associated objects. “At least one of” and similar expressions refer to any combination of items listed, including one item or any combination of a plurality of items. For example, at least one of a, b, or c may represent a, b, c, "a and b", "a and c", "b and c", or "a, b, and c", where a, b, and c may be singular or plural.

In addition, the technical features involved in various embodiments of the present disclosure described below can be combined with each other as long as they do not form a conflict with each other.

The power amplification circuit involved in the embodiments of the present disclosure is based on the Doherty technology, which is an efficient technology for increasing power amplifier efficiency and has been widely used in existing communication devices. In the actual network environments of various communication operators, conventional power amplifiers such as Class A and Class AB power amplifiers have low amplification efficiency for non-constant envelope signals, especially in a high-power back-off range, while Doherty power amplification structures can increase the power amplification efficiency in some power back-off cases.

In related technologies, there are two methods for increasing efficiency for high-power back-off using Doherty circuits. In one method, two asymmetric Doherty circuits are used. Such circuits have two maximum efficiency points at the maximum output power and the fixed back-off point. However, the back-off efficiency drops very fast between the two maximum efficiency points, and the average output power of the signal is just between the two points, so the increase in the final power amplification efficiency is limited. In the other method, three Doherty circuits are used. There are three maximum efficiency points at the maximum output power and the fixed back-off point. This method has higher efficiency than that using two asymmetric Doherty circuits, but has the problem of over-compression of the main amplifier tube, leading to unsatisfactory linearity of the power amplifier, an increased pre-distortion difficulty, limited impedance selections for load pulling, and great design limitations. In addition, such amplifiers include a large number of quarter-wave impedance compensation lines, leading to a decrease in relative bandwidth and an increase in the printed circuit board (PCB) layout area.

FIG. 1 is a block diagram of a conventional power amplification circuit. As shown in FIG. 1, a conventional power amplification circuit includes a power distribution device S, a carrier amplification device M, a first peak amplification device T1, a second peak amplification device T2, a first impedance compensation line Z1, and a second impedance compensation line Z2. The conventional power amplification circuit further includes three quarter-wave impedance transformation lines Z3, Z4, and Z5 and a 50 ohm antenna load. One end of the 50 ohm antenna load is grounded. Active load modulation is implemented through Z3 and Z4. The first impedance compensation line Z1 and the second impedance compensation line Z2 are respectively connected to an output end of the first peak amplification device T1 and an output end of the second peak amplification device T2. Matching between load impedance and impedance of a 50 ohm output terminal is implemented through Z5. It should be understood that although the circuit has a fixed impedance relationship and is easy to design and debug to meet indicator requirements, it has several shortcomings. First, the input signal gradually changes increasingly. When the input signal increases to such a degree that the first peak amplification device T1 is saturated and the second peak amplification device T2 operates, the carrier amplification device M enters an over-saturated state due to undue pulling by the first peak amplification device T1. Consequently, the efficiency of the carrier amplification device M decreases and the highest efficiency cannot be maintained until the three power amplifier tubes reach power saturation. Second, in terms of the impedance matching relationship, impedance selections supported by the circuit are relatively fixed, leading to low design flexibility. Third, the quarter-wave impedance transformation lines Z3 and Z4 occupy too much PCB area, which is not conducive to miniaturization and cost saving.

In view of the above, the embodiments of the present disclosure provide a power amplification circuit and a power amplifier, to effectively improve the efficiency of power amplification, simplify the structure of the power amplification circuit, achieve a flexible impedance design for load testing, and reduce the design difficulty of the power amplifier.

Figure 2:
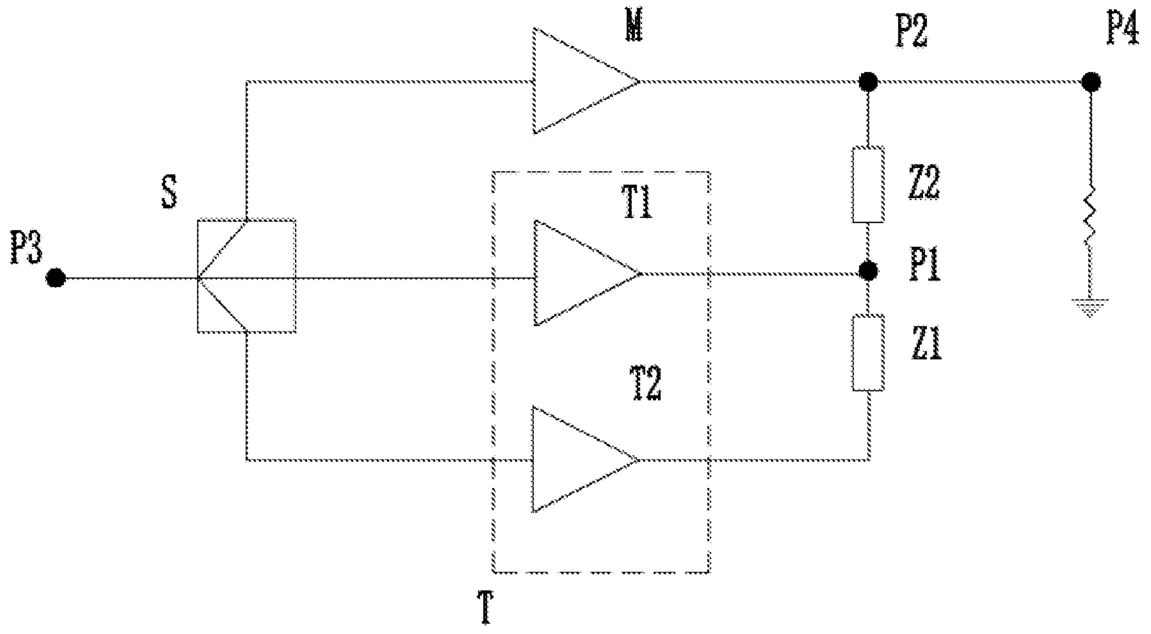
FIG. 2 is a block diagram of a power amplification circuit according to an embodiment of the present disclosure.

FIG. 2 is a block diagram of a power amplification circuit according to an embodiment of the present disclosure. As shown in FIG. 2, the power amplification circuit provided in an embodiment of the present disclosure includes a power distribution device S, a carrier amplification device M, and a plurality of peak amplification devices T. The plurality of peak amplification devices T include at least a first peak amplification device T1 and a second peak amplification device T2.

The power distribution device S is configured for dividing an input power to obtain a plurality of divided powers. The plurality of divided powers are respectively output to input ends of the carrier amplification device and the peak amplification devices.

A first combining point P1 is arranged at an output end of the first peak amplification device T1. An output end of the second peak amplification device T2 is connected to the first combining point P1 by a first impedance compensation device Z1.

A second combining point P2 is arranged at an output end of the carrier amplification device M. The first combining point P1 is connected to the second combining point P2 by a second impedance compensation device Z2.

It should be understood that according to the characteristics of Doherty circuits, a circuit passing through the carrier amplification device M is a main amplification circuit (main amplifier) and the rest is an auxiliary amplification circuit (auxiliary amplifier). The phases of the two paths are balanced by the first impedance compensation device Z1 and the second impedance compensation device Z2.

In an implementation process, an output end P4 of the amplification circuit is connected to a 50 ohm antenna load. One end of the 50 ohm antenna load is grounded. Power of the second peak amplification device T2 is combined with power of the first peak amplification device T1 through the first impedance compensation device Z1 to form the first combining point P1. The first combining point P1 is combined with the carrier amplification device M through the second impedance compensation device Z2 to form the second combining point P2.

For example, the first impedance compensation device Z1 and the second impedance compensation device Z2 may be configured to various impedance values as long as the corresponding impedance relationship is satisfied. Such a flexible impedance matching design facilitates PCB design and does not cause performance degradation due to large PCB machining errors caused by too high impedance. As shown in FIG. 2, the impedance relationship between the first impedance compensation device Z1 and the second impedance compensation device Z2 is adjusted such that the power amplification circuit has an impedance of 50 ohms at the second combining point P2, and then the second combining point P2 is directly connected to the 50 ohm antenna load, thereby further reducing the PCB layout area and reducing costs.

It should be understood that to enable the carrier amplification device M and the peak amplification device T to match to an appropriate impedance point to ensure the power, efficiency, gain and the like of the power amplification circuit, a carrier input matching circuit and a carrier output matching circuit are respectively arranged at the two ends of the carrier amplification device M, and a peak input matching circuit and a peak output matching circuit are respectively arranged at the two ends of the peak amplification device T. Both the input matching circuit and the output matching circuit are known in existing technologies and will not be described in detail herein.

Figure 4:
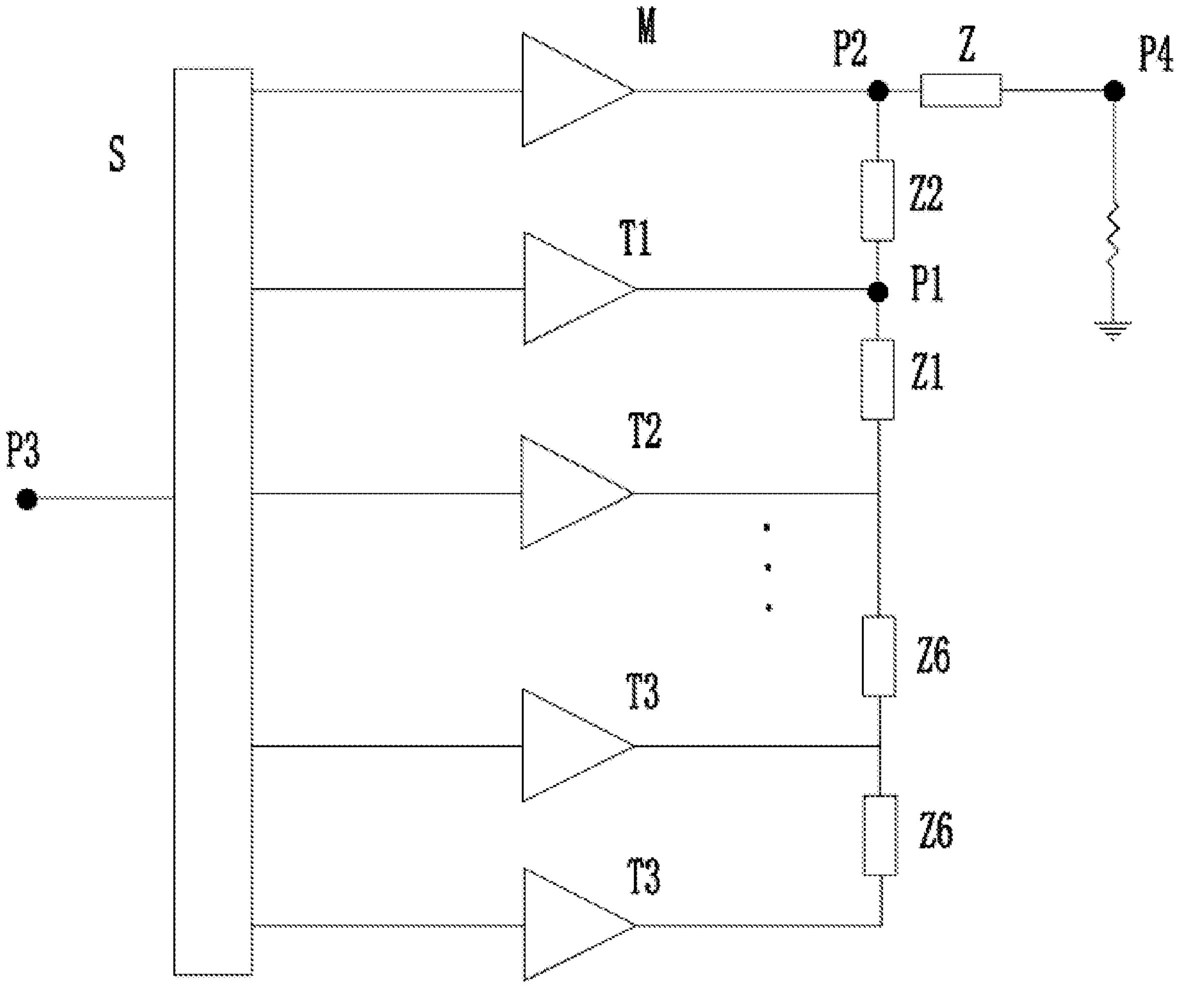
FIG. 4 is a block diagram of a power amplification circuit according to another embodiment of the present disclosure.

FIG. 4 is a block diagram of a power amplification circuit according to another embodiment of the present disclosure. As shown in FIG. 4, the peak amplification device T further includes a third peak amplification device T3, and an output end of the third peak amplification device T3 is connected to the output end of the adjacent peak amplification device T by a third impedance compensation device Z6.

In an implementation process, every time one third peak amplification device T3 is added, a third impedance compensation device Z6 may need to be added to the output end of the third peak amplification device T3, to ensure that the circuit is in a high impedance state when viewed from the second combining point P2 to the third peak amplification device T3 when the third peak amplification device T3 is not operating.

Figure 3:
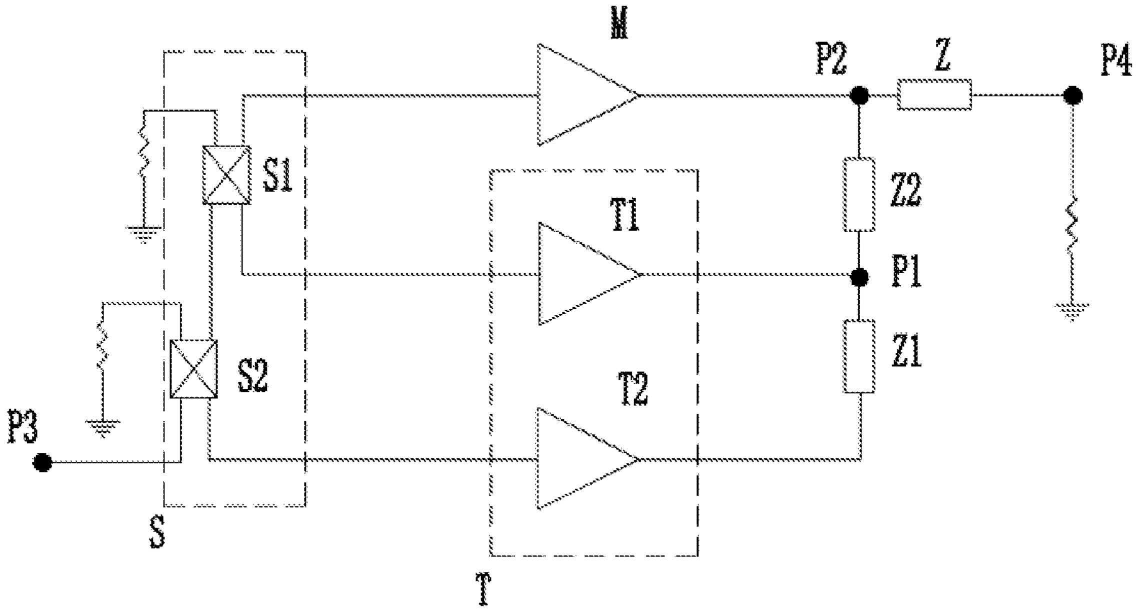
FIG. 3 is a block diagram of a power amplification circuit according to another embodiment of the present disclosure.

FIG. 3 and FIG. 4 are block diagrams of a power amplification circuit according to an embodiment of the present disclosure. As shown in FIG. 3 and FIG. 4, a quarter-wave impedance transformation line Z is arranged between the second combining point P2 and an output end of the power amplification circuit P4.

In an implementation process, signals amplified by the carrier amplification device M and the peak amplification device T are acquired and combined by the second combining point P2, and the combined signal reaches the output end P4 of the power amplification circuit through the quarter-wave impedance transformation line Z, such that the impedance of the power amplification circuit is 50 ohms, and the signals at the output end P4 can be directly transmitted to the 50 ohm antenna load.

It should be understood that in this case, the second combining point P2 is connected to a first branch extending from the output end of the carrier amplification device M to the second combining point P2, and an output of the first branch is connected to the 50 ohm antenna load by the quarter-wave impedance transformation line Z. The second combining point P2 is further connected to a second branch extending from the output end of the first peak amplification device T1 to the second combining point P2 through the first combining point P1 and the second impedance compensation device Z2 in sequence. An output of the second branch is also connected to the 50 ohm antenna load by the quarter-wave impedance transformation line Z. The second combining point P2 is further connected to a third branch extending from the second peak amplification device T2 to the second combining point P2 through the first impedance compensation device Z1, the first combining point P1, and the second impedance compensation device Z2 in sequence. An output of the third branch is also connected to the 50 ohm antenna load by the quarter-wave impedance transformation line Z.

FIG. 3 is a block diagram of a power amplification circuit according to another embodiment of the present disclosure. As shown in FIG. 3, the power distribution device S includes a plurality of quadrature couplers, and the plurality of quadrature couplers are connected to an input end of the power amplification circuit.

In the power amplification circuit provided in the embodiment of the present disclosure, the plurality of quadrature couplers at least include a first quadrature coupler S1 and a second quadrature coupler S2. An output end of the first quadrature coupler S1 is respectively connected to the input end of the carrier amplification device M and an input end of the first peak amplification device T1. An output end of the second quadrature coupler S2 is respectively connected to an input end of the first quadrature coupler S1 and an input end of the second peak amplification device T2.

For example, the first quadrature coupler S1 and the second quadrature coupler S2 equally divide the input power to obtain three divided powers. The output end of the first quadrature coupler S1 and the output end of the second quadrature coupler S2 respectively output three identical divided powers and respectively transmit the divided powers to the carrier amplification device M, the first peak amplification device T1, and the second peak amplification device T2.

In the power amplification circuit provided in the embodiment of the present disclosure, the power distribution device S further includes a third quadrature coupler (not shown). An output end of the third quadrature coupler is respectively connected to an input end of the adjacent quadrature coupler and an input end of the third peak amplification device T3. An input end of the last third quadrature coupler is connected to the input end P3 of the power amplification circuit.

In an implementation process, every time one third peak amplification device T3 is added, in order to ensure that the power distribution device S can divide the input power to obtain a plurality of divided powers and the plurality of divided powers can be respectively output to the input end of the carrier amplification device M and the input end of the peak amplification device T, a third orthogonal coupler connected to the third peak amplification device T3 may need to be added. The output end of the third quadrature coupler is respectively connected to the input end of an adjacent quadrature coupler and the input end of the third peak amplification device T3, and the input end P3 of the power amplification circuit is connected to the input end of the last third quadrature coupler, to ensure the connectivity between the power distribution device S and the input end P3 of the power amplification circuit.

In the power amplification circuit provided in the embodiment of the present disclosure, the power distribution device further includes a 50 ohm impedance line (not shown), configured for performing phase matching on an output signal from the quadrature coupler, to enable an output end of the power distribution device S and an output end P4 of the power amplification circuit to keep the same phase.

It should be understood that the 50 ohm impedance line provides a phase compensation function, such that the carrier amplification device M and the peak amplification device T have the same phase between the input end P3 and the output end P4 of the power amplification circuit, thereby avoiding occurrence of a phase difference between the input ends of the carrier amplification device M and the peak amplification device T and the output end P4 of the power amplification circuit, so as not to affect the stability of the power amplification circuit.

In the power amplification circuit provided in the embodiment of the present disclosure, a power level of the carrier amplification device M is consistent with a power level of the peak amplification device T.

It should be understood that when amplifiers are mass-produced, the power level of the carrier amplification device M is consistent with the power level of the peak amplification device T, such that the total number of different amplifiers can be effectively reduced. Generally, a power transistor of the carrier amplification device M and a power transistor of the first peak amplification device T1 may be packaged together, and a power transistor of the second peak amplification device T2 may be packaged separately. Alternatively, the power transistor of the carrier amplification device M is packaged separately, and the power transistor of the first peak amplification device T1 and the power transistor of the second peak amplification device T2 are packaged together. Alternatively, the power transistor of the carrier amplification device M, the power transistor of the first peak amplification device T1, and the power transistor of the second peak amplification device T2 are integrated on a single tube core. In this way, the complexity and costs associated with processing of different packages in the manufacturing process can be effectively reduced.

It should be understood that to adapt to power amplification circuits with different parameter ranges, the power level of the carrier amplification device M and the power level of the peak amplification device T can be arbitrarily combined. For example, capacities of the carrier amplification device M, the first peak amplification device T1, and the second peak amplification device T2 are selected according to a signal amplification requirement, and the carrier amplification device M can be used in combination with an on-state threshold of the peak amplification devices T to meet amplification requirements of different power signals, thereby expanding the application range of the power amplification circuit and reducing the design difficulty of the power amplification circuit.

In the power amplification circuit provided in the embodiment of the present disclosure, a gate voltage of the carrier amplification device M is configured to be Class AB; and a gate voltage of the peak amplification device T is configured to be Class C.

In an implementation process, drain voltage values of the three power amplifiers are separately configured, and gate voltages of the three power amplifiers are also separately configured, such that the three power amplifiers operate in different operating states. The gate voltage of the carrier amplification device M is configured to be Class AB, the gate voltage of the first peak amplification device T1 is configured to be in a Class C operating state, and the gate voltage of the second peak amplification device T2 is configured to be in a Class C operating state.

For example, using the power amplification circuit shown in FIG. 3 as an example, the operating state of the power amplification circuit provided in the embodiment of the present disclosure is divided into the following three stages.

When the input signal is small, only the carrier amplification device M operates, and the signal passes through the second combining point P2 and then passes through the quarter-wave impedance transformation line Z, such that the impedance of the output end P4 of the power amplification circuit is 50 ohms, and then is connected to the 50 ohm antenna load. In this case, the carrier amplification device M operates in a high impedance state, such that the voltage saturation point of the carrier amplification device M is reached earlier, reaching a maximum efficiency point. In this case, because the input signal does not reach the on-state thresholds of the peak amplification devices T, the peak amplification devices T do not operate, no signal passes through the second branch and the third branch at the second combining point P2, and the second branch and the third branch are in an open state when viewed from the second combining point P2.

The input signal continues to increase. When the signal increases to the on-state threshold of the first peak amplification device T1, the second branch to which the first peak amplification device T1 is connected enters a closed state, and the second branch supplies a current (which is the same as the current of the main amplification circuit) to the 50 ohm antenna load to increase the voltage at the second combining point P2. In this way, the output impedance of the carrier amplification device M in the first branch when viewed from the second combining point P2 is reduced by active load pulling, such that the output current of the carrier amplification device M continues to increase, i.e., the output power of the carrier amplification device M increases. The signal continues to increase until the first peak amplification device T1 reaches voltage saturation, forming a second maximum efficiency point. In this case, the third branch is not closed, the signal at the second combining point P2 is contributed by the first branch and the second branch, and the third branch is in an open state when viewed from the second combining point P2.

Then, the input signal continues to increase. Finally, when the signal increases to the on-state threshold of the second peak amplification device T2, the second peak amplification device T2 is turned on. As the current contributed by the second peak amplification device T2 to the second combining point P2 increases, the voltage at the second combining point P2 increases, i.e., the output impedance of the second branch where the first peak amplification device T1 is located decreases, such that the current of the first peak amplification device T1 increases and the output power of the first peak amplification device T1 increases. At the same time, the current at the second combining point P2 increases and the voltage at the second combining point P2 rises. The output impedance of the first branch where the carrier amplification device M is located continues to decrease, and the current of the first branch continues to increase. The output power of the carrier amplification device M continues to increase to reach power saturation. The decrease of the output impedance of the second peak amplification device T2 leads to an increase in the current, and the output power of the carrier amplification device M continues to increase until current saturation is reached.

It should be understood that the peak-to-average ratio of the input signal and the magnitude of the output power of the signal amplified by the Doherty circuit are known, so after the capacities of the carrier amplification device M, the first peak amplification device T1, and the second peak amplification device T2 are determined, the positions of two maximum efficiency points after total power back-off can be acquired according to the above parameter indicators. The calculation method may be expressed by the following formula:

$$P1:P2:P3=m2:m1(1-m2):(1-m1)(1-m2).$$

Then, the following formula is obtained:

$$m1 = \frac{P2}{P2 + P3}$$

$$m2 = \frac{P1}{P1 + P2 + P3}$$

where m1 represents a first power back-off point, m2 represents a second power back-off point, P1 represents the power capacity of the carrier amplification device M, P2 represents the power capacity of the first peak amplification device T1, and P3 represents the power capacity of the second peak amplification device T2.

When the carrier amplification device M, the first peak amplification device T1, and the second peak amplification device T2 operate and the output impedance of the carrier amplification device M is Z0, the output impedance of the second impedance compensation device Z2 and the quarter-wave impedance transformation line Z may be calculated using the following formulas:

$$Z2 = Z0 * m1$$

$$Z = \sqrt{Z0 * m2 * 50}.$$

In addition, the first impedance compensation device Z1 equals to the output impedance of the second peak amplification device T2 when all the three power amplifiers operate. The first impedance compensation device Z1 can be arbitrarily configured, as long as the output impedance of the first peak amplification device T1 and the output impedance of the second peak amplification device T2 in parallel are equal to Z2 when all the three power amplifiers operate. The first impedance compensation device Z1 is configured such that when the third peak amplification device T3 is not operating, the second peak amplification device T2 is in a high impedance state when viewed from the second combining point P2. The length of the first impedance compensation device Z1 is determined by the characteristics of the second peak amplification device T2. The second impedance compensation device Z2 is configured such that when only the carrier amplification device M operates, the first peak amplification device T1 is in a high impedance state when viewed from the second combining point P2. The length of the second impedance compensation device Z2 is determined by the characteristics of the first peak amplification device T1.

For example, it is assumed that a power ratio of the carrier amplification device M, the first peak amplification device T1, and the second peak amplification device T2 is 1:1:1, and the output impedance of the carrier amplification device M is Z0=75 ohms when all the three amplifiers operate. In this case, Z2=37.5 ohms, Z=35.4 ohms, and Z1=75 ohms according to a calculation relationship. The first efficiency back-off point is at −6 dB, and the second efficiency back-off point is at −9.5 dB. Based on the above, the impedance transformation in the power amplification circuit provided in the embodiment of the present disclosure is very flexible, and no complex transformation relationship in other circuits are involved. After the power ratio is determined, the output impedance Z0 of the carrier amplification device M can be arbitrarily set, and then Z and Z2 are determined. In addition, a large back-off range can be achieved with a small power ratio.

It should be understood that in some particular embodiments, the carrier amplification device M, the first peak amplification device T1, and the second peak amplification device T2 are identical. This does not mean that the amplification devices have the same configuration, but merely indicate that the physical structures of these amplification devices are the same, to facilitate mass processing and production of the amplification device.

For example, the power ratio of the carrier amplification device M, the first peak amplification device T1, and the second peak amplification device T2 is changed by adjusting the value of Z0, such that the impedance of the power amplification circuit is the same as the actual load impedance when Z=50 ohms. In this case, the quarter-wave impedance transformation line Z can be omitted, and the circuit is simplified into the structure shown in FIG. 2, where the second combining point P2 is the output terminal, thereby further saving the PCB layout area and reducing costs. It can be seen that the power amplification circuit provided in the embodiment of the present disclosure has the advantages of simple output impedance design and few output impedance transformation lines, and realizes a high-power and high-efficiency output design with a very small PCB layout area, thereby reducing the PCB costs and achieving a more miniaturized hardware design.

It should be understood that when the power amplification circuit includes the third peak amplification device T3, and the third impedance compensation device Z6 and the third quadrature coupler which are connected the third peak amplification device T3, the output power of the output end P4 of the power amplification circuit can be further increased, thereby improving the amplification efficiency of the power amplification circuit. Because only the third peak amplification device T3 and the third impedance compensation device Z6 and the third quadrature coupler matching the third peak amplification device T3 may need to be added, the PCB layout can be conveniently designed, thereby improving the design flexibility of the power amplification circuit, and facilitating mass production of power amplifiers.

It should be understood that compared with the existing technologies, the power amplification circuit provided in the embodiment of the present disclosure realizes efficiency improvement under high back-off power by redesigning the three-way Doherty output load modulation network, and obviates the use of the quarter-wave impedance transformation line Z for load modulation, thereby reducing the PCB layout area of the Doherty power amplifier. In addition, the present disclosure achieves a flexible impedance design for load testing, and reduces the difficulty in the selection of power amplifier tubes and the difficulty in PCB design. In the embodiment of the present disclosure, the impact of the connection of the peak amplification device T on the carrier amplification device M is reduced through impedance optimization, thereby reducing the impact on the efficiency and linearity of the entire power amplification circuit. As shown in FIG. 4, the embodiment of the present disclosure can also be extended to multi-way Doherty power amplification circuits to achieve efficiency improvement and PCB design at higher back-off power, which will not be described in detail herein.

An embodiment of the present disclosure provides a power amplifier, including the power amplification circuit described above. It should be noted that the information exchange and execution processes of the power amplifier are based on the same idea as the power amplification circuit provided in the embodiments of the present disclosure. For specific functions and technical effects of the power amplifier, reference may be made to the descriptions in the embodiment of the power amplification circuit, and the details will not be repeated herein.

It should be understood that the power amplification circuit and the power amplifier provided in the embodiments of the present disclosure can be used in various scenarios where radio frequency signals may need to be amplified, including, but not limited to, communication base stations and radar systems.

The embodiments described above are merely examples. The units described as separate components may or may not be physically separated, i.e., may be located in one place or may be distributed over a plurality of network units. Some or all of the modules may be selected according to actual needs to achieve the objects of the scheme of this embodiment.

Those having ordinary skills in the art can understand that all or some of the steps in the methods disclosed above and the functional modules/units in the system and the apparatus can be implemented as software, firmware, hardware, and appropriate combinations thereof. Some or all physical components may be implemented as software executed by a processor, such as a central processing unit, a digital signal processor, or a microprocessor, or as hardware, or as an integrated circuit, such as an application-specific integrated circuit. Such software may be distributed on a computer-readable medium, which may include a computer storage medium (or non-transitory medium) and a communication medium (or transitory medium). As is known to those having ordinary skills in the art, the term "computer storage medium" includes volatile and nonvolatile, removable and non-removable media implemented in any method or technology for storage of information (such as computer-readable instructions, data structures, program modules, or other data). The computer storage medium includes, but is not limited to, a Random Access Memory (RAM), a Read-Only Memory (ROM), an Electrically Erasable Programmable Read-Only Memory (EEPROM), a flash memory or other memory technology, a Compact Disc Read-Only Memory (CD-ROM), a Digital Versatile Disc (DVD) or other optical storage, a cassette, a magnetic tape, a magnetic disk storage or other magnetic storage device, or any other medium which can be used to store the desired information and which can be accessed by a computer. In addition, as is known to those having ordinary skills in the art, the communication medium typically includes computer-readable instructions, data structures, program modules, or other data in a modulated data signal such as a carrier or other transport mechanism, and can include any information delivery medium.

Although some embodiments of the present disclosure have been described above, the present disclosure is not limited to the implementations described above. Those having ordinary skills in the art can make various equivalent modifications or replacements without departing from the essence of the present disclosure. Such equivalent modifications or replacements fall within the scope defined by the claims of the present disclosure.

What is claimed is:

1. A power amplification circuit, comprising:

a power distribution device, a carrier amplification device, and a plurality of peak amplification devices, wherein the plurality of peak amplification devices comprise at least a first peak amplification device and a second peak amplification device;

the power distribution device is configured for dividing an input power to obtain a plurality of divided powers, and the plurality of divided powers are respectively output to input ends of the carrier amplification device and the peak amplification devices;

a first combining point is arranged at an output end of the first peak amplification device, and an output end of the second peak amplification device is connected to the first combining point by a first impedance compensation device; and a second combining point is arranged at an output end of the carrier amplification device, and the first combining point is connected to the second combining point by a second impedance compensation device;

wherein the peak amplification device further comprises a third peak amplification device, and an output end of the third peak amplification device is connected to an output end of an adjacent peak amplification device by a third impedance compensation device;

wherein the power distribution device comprises a plurality of quadrature couplers, and the plurality of quadrature couplers are connected to an input end of the power amplification circuit;

wherein the plurality of quadrature couplers at least comprise a first quadrature coupler and a second quadrature coupler;

an output end of the first quadrature coupler is respectively connected to the input end of the carrier amplification device and an input end of the first peak amplification device; and an output end of the second quadrature coupler is respectively connected to an input end of the first quadrature coupler and an input end of the second peak amplification device.

2. The power amplification circuit of claim 1, wherein a quarter-wave impedance transformation line is arranged between the second combining point and an output end of the power amplification circuit.

3. The power amplification circuit of claim 1, wherein the power distribution device further comprises a third quadrature coupler;

an output end of the third quadrature coupler is respectively connected to an input end of an adjacent quadrature coupler and an input end of the third peak amplification device; and an input end of a last third quadrature coupler is connected to the input end of the power amplification circuit.

4. The power amplification circuit of claim 1, wherein the power distribution device further comprises:

a 50 ohm impedance line, configured for performing phase matching on an output signal from one of the plurality of quadrature couplers to enable an output end of the power distribution device and an output end of the power amplification circuit to keep the same phase.

5. The power amplification circuit of claim 1, wherein a power level of the carrier amplification device is consistent with a power level of the peak amplification device.

6. The power amplification circuit of claim 5, wherein a gate voltage of the carrier amplification device is configured to be Class AB; and a gate voltage of the peak amplification device is configured to be Class C.

7. A power amplifier, comprising a power amplification circuit, the power amplification circuit comprising: a power distribution device, a carrier amplification device, and a plurality of peak amplification devices, wherein the plurality of peak amplification devices comprise at least a first peak amplification device and a second peak amplification device;

the power distribution device is configured for dividing an input power to obtain a plurality of divided powers, and the plurality of divided powers are respectively output to input ends of the carrier amplification device and the peak amplification devices;

a first combining point is arranged at an output end of the first peak amplification device, and an output end of the second peak amplification device is connected to the first combining point by a first impedance compensation device; and a second combining point is arranged at an output end of the carrier amplification device, and the first combining point is connected to the second combining point by a second impedance compensation device;

wherein the peak amplification device further comprises a third peak amplification device, and an output end of the third peak amplification device is connected to an output end of an adjacent peak amplification device by a third impedance compensation device;

wherein the power distribution device comprises a plurality of quadrature couplers, and the plurality of quadrature couplers are connected to an input end of the power amplification circuit;

wherein the plurality of quadrature couplers at least comprise a first quadrature coupler and a second quadrature coupler;

an output end of the first quadrature coupler is respectively connected to the input end of the carrier amplification device and an input end of the first peak amplification device; and an output end of the second quadrature coupler is respectively connected to an input end of the first quadrature coupler and an input end of the second peak amplification device.

8. The power amplifier of claim 7, wherein a quarter-wave impedance transformation line is arranged between the second combining point and an output end of the power amplification circuit.

9. The power amplifier of claim 7, wherein the power distribution device further comprises a third quadrature coupler;

an output end of the third quadrature coupler is respectively connected to an input end of an adjacent quadrature coupler and an input end of the third peak amplification device; and an input end of a last third quadrature coupler is connected to the input end of the power amplification circuit.

10. The power amplifier of claim 7, wherein the power distribution device further comprises:

a 50 ohm impedance line, configured for performing phase matching on an output signal from one of the plurality of quadrature couplers to enable an output end of the power distribution device and an output end of the power amplification circuit to keep the same phase.

11. The power amplifier of claim 7, wherein a power level of the carrier amplification device is consistent with a power level of the peak amplification device.

12. The power amplifier of claim 11, wherein a gate voltage of the carrier amplification device is configured to be Class AB; and a gate voltage of the peak amplification device is configured to be Class C.

13. The power amplification circuit of claim 1, wherein a power level of the carrier amplification device is inconsistent with a power level of the peak amplification device.

14. The power amplifier of claim 7, wherein a power level of the carrier amplification device is inconsistent with a power level of the peak amplification device.

* * * * *